United States Patent
Koechlin

(10) Patent No.: US 9,166,564 B2
(45) Date of Patent: Oct. 20, 2015

(54) WIDEBAND ANALOG BANDPASS FILTER

(75) Inventor: Michael Koechlin, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 608 days.

(21) Appl. No.: 12/931,487

(22) Filed: Feb. 1, 2011

(65) Prior Publication Data

US 2011/0187448 A1 Aug. 4, 2011

Related U.S. Application Data

(60) Provisional application No. 61/337,474, filed on Feb. 4, 2010.

(51) Int. Cl.
*H03H 7/01* (2006.01)
*H03H 7/12* (2006.01)
*H03J 3/26* (2006.01)

(52) U.S. Cl.
CPC .............. *H03J 3/26* (2013.01); *H03H 7/0161* (2013.01); *H03H 7/1775* (2013.01); *H03H 2210/012* (2013.01); *H03H 2210/015* (2013.01)

(58) Field of Classification Search
CPC ..... H03H 7/0123; H03H 7/0161; H03H 7/06; H03H 7/065; H03H 7/07; H03H 7/12
USPC ......... 333/168, 175, 176, 204, 205, 219, 235, 333/81 A, 174
See application file for complete search history.

(56) References Cited

U.S. PATENT DOCUMENTS

| 2,029,014 | A | * | 1/1936 | Bode | 333/170 |
|---|---|---|---|---|---|
| 2,043,345 | A | * | 6/1936 | Bobis | 333/170 |
| 3,110,004 | A | | 11/1963 | Pope | |
| 5,291,159 | A | | 3/1994 | Vale | |
| 5,376,907 | A | | 12/1994 | Duflot et al. | |
| 6,018,282 | A | * | 1/2000 | Tsuda | 333/205 |
| 7,202,726 | B2 | * | 4/2007 | Kunanayagam et al. | 327/274 |
| 7,305,223 | B2 | * | 12/2007 | Liu et al. | 455/333 |
| 7,339,446 | B2 | * | 3/2008 | Su et al. | 333/174 |
| 7,508,284 | B2 | * | 3/2009 | Shafer | 333/132 |
| 2001/0035803 | A1 | * | 11/2001 | Matsumura et al. | 333/185 |
| 2004/0130414 | A1 | * | 7/2004 | Marquardt et al. | 333/174 |
| 2008/0238569 | A1 | * | 10/2008 | Matsuo | 333/32 |

OTHER PUBLICATIONS

Rais-Zadeh M. et al.: "An Integrated 800-MHz Coupled-Resonator Tunable Bandpass Filter in Silver With a Constant Bandwidth", Journal of Microelectromechanical Systems, IEEE Service Center, Piscataway, NJ, vol. 18, No. 4, Aug. 1, 2009, pp. 942-949, XP011269210.

* cited by examiner

*Primary Examiner* — Benny Lee
*Assistant Examiner* — Gerald Stevens
(74) *Attorney, Agent, or Firm* — Knobbe, Martens, Olson & Bear, LLP

(57) ABSTRACT

A wideband bandpass filter includes an RF input terminal, an RF output terminal, a plurality of electrically tunable coupling capacitors coupled in series between the RF input and output terminals, and a plurality of resonating circuits each including an electrically tunable resonator capacitor coupled to one of the coupling capacitors. At least one resistance is coupled in series between at least one of the coupling capacitors for providing enhanced out of band rejection of the filter.

24 Claims, 6 Drawing Sheets

Frequency and Bandwidth tuning together

Bandwidth tuning Only

Bonding diagram of Die in surface mount package

WIDEBAND ANALOG BANDPASS FILTER

RELATED APPLICATIONS

This application hereby claims the benefit of and priority to U.S. Provisional Application Ser. No. 61/337,474, filed on Feb. 4, 2010 under 35 U.S.C. §§119, 120, 363, 365, and 37 C.F.R. §1.55 and §1.78, which application is herein incorporated by reference.

FIELD OF THE INVENTION

This invention relates to an analog bandpass filter.

BACKGROUND OF THE INVENTION

There are many applications in which it is desirable to have a bandpass filter with high linearity such that a minimal amount of spurious are generated when subjected to an input spectrum with multiple tones. In some applications, it is also desirable for a bandpass filter to be tunable in both center frequency and bandwidth.

Bandpass filters are known in the art. U.S. Pat. No. 3,110,004 relates to a prior tunable bandpass filter, FIG. 1, which includes a multiple tuned resonator filter with each tuned section including a variable reactance device, i.e., a single varactor. The filter also includes a reactive coupling network with its own variable reactance device, and a variable reactance divider at the input of the first resonator which also incorporates a variable reactance device. One disadvantage of the filter in FIG. 1 is that its linearity is less than desirable.

U.S. Pat. No. 5,376,907 relates to another filter, shown in FIG. 2, in which the tuning voltage applied to the resonator varactors is identical to the voltage applied to the coupling varactors. As such, this filter cannot provide independent control of the frequency and the bandwidth.

BRIEF SUMMARY OF THE INVENTION

It is therefore an object of this invention to provide a bandpass filter that has high linearity.

It is a further object of this invention to provide such a bandpass filter which is tunable in both center frequency and bandwidth.

The invention results from the realization that an improved bandpass filter that has high linearity can be achieved by a plurality of electrically tunable coupling capacitors coupled in series between the RF input and output terminals, and at least one resistance coupled in series between at least one of the coupling capacitors for providing enhanced out of band rejection of the filter. The bandpass filter also includes a plurality of resonating circuits that each includes an electrically tunable resonator capacitor coupled to one of the coupling capacitors. In embodiments of the invention, the bandpass filter includes control circuits to tune the center frequency and bandwidth of the filter.

The subject invention, however, in other embodiments, need not achieve all these objectives and the claims hereof should not be limited to structures or methods capable of achieving these objectives.

This invention features a bandpass filter which includes an RF input terminal; an RF output terminal; a plurality of electrically tunable coupling capacitors coupled in series between the RF input and output terminals; a plurality of resonating circuits each including an electrically tunable resonator capacitor coupled to one of the coupling capacitors; and at least one resistance coupled between the RF input and output terminals in series with at least one of the coupling capacitors for providing enhanced out of band rejection of the filter.

In one embodiment, the filter may include a first control circuit coupled to the coupling capacitors to adjust the bandwidth of the filter system. The first control circuit may include a bandwidth control terminal, and an inductance and a resistance coupled in series between the bandwidth control terminal and each of the coupling capacitors for tuning the coupling capacitors.

The filter may further include a second control circuit coupled to the resonator capacitors of the resonating circuits to adjust the center frequency of the filter system. The filter in which the second control circuit may include a frequency control terminal, and an inductance and a resistance coupled in series between the frequency control terminal and each of the resonating capacitors for tuning the resonating circuits.

Each of the capacitors may be a varactor. Each of the varactors may include two diodes coupled together. Each of the varactors may include only one diode. The filter may be implemented on a planar monolithic substrate. The monolithic substrate may be selected from the group of GaAs or SiGe. The varactors may include a p-n junction. The varactors may include a field effect transistor (FET) and uses a capacitance between a gate and a source of the FET. Each capacitor may include a ferroelectric based capacitor. Each varactor may include a MEMS-based capacitor. The monolithic substrate may be mounted in a surface-mount package. The filter in which the at least one resistance may be a non-parasitic resistance. The at least one resistance may include two resistances coupled together with one of the resonating circuits coupled to a node between the two resistances.

The at least one resistance has a value between a range of greater than zero and 100 Ohms.

The invention also features a bandpass filter including an RF input terminal; an RF output terminal; a plurality of electrically tunable pairs of varactors coupled back-to-back in series between the RF input and output terminals; a plurality of resonating circuits each including an electrically tunable resonator capacitor coupled to one of the pairs of varactors; and at least one resistance coupled in series between at least one of the pairs of varactors for providing enhanced out of band rejection of the filter.

In one embodiment, the filter may include a first control circuit coupled to at least one of the pairs of varactors to adjust the bandwidth of the filter system. The first control circuit may include a frequency control terminal, and an inductance and a resistance coupled in series between the frequency control terminal and each of the pairs of varactors for tuning the pairs of varactors. The filter may include a second control circuit coupled to at least one of the resonator capacitors of the resonating circuits to adjust the center frequency of the filter system. The second control circuit may include a frequency control terminal, and an inductance and a resistance coupled in series between the frequency control terminal and each of the resonating capacitors for tuning the resonating circuits.

The configuration of the filter may include a Chebyshev filter. The Chebyshev filter may be a third order filter.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
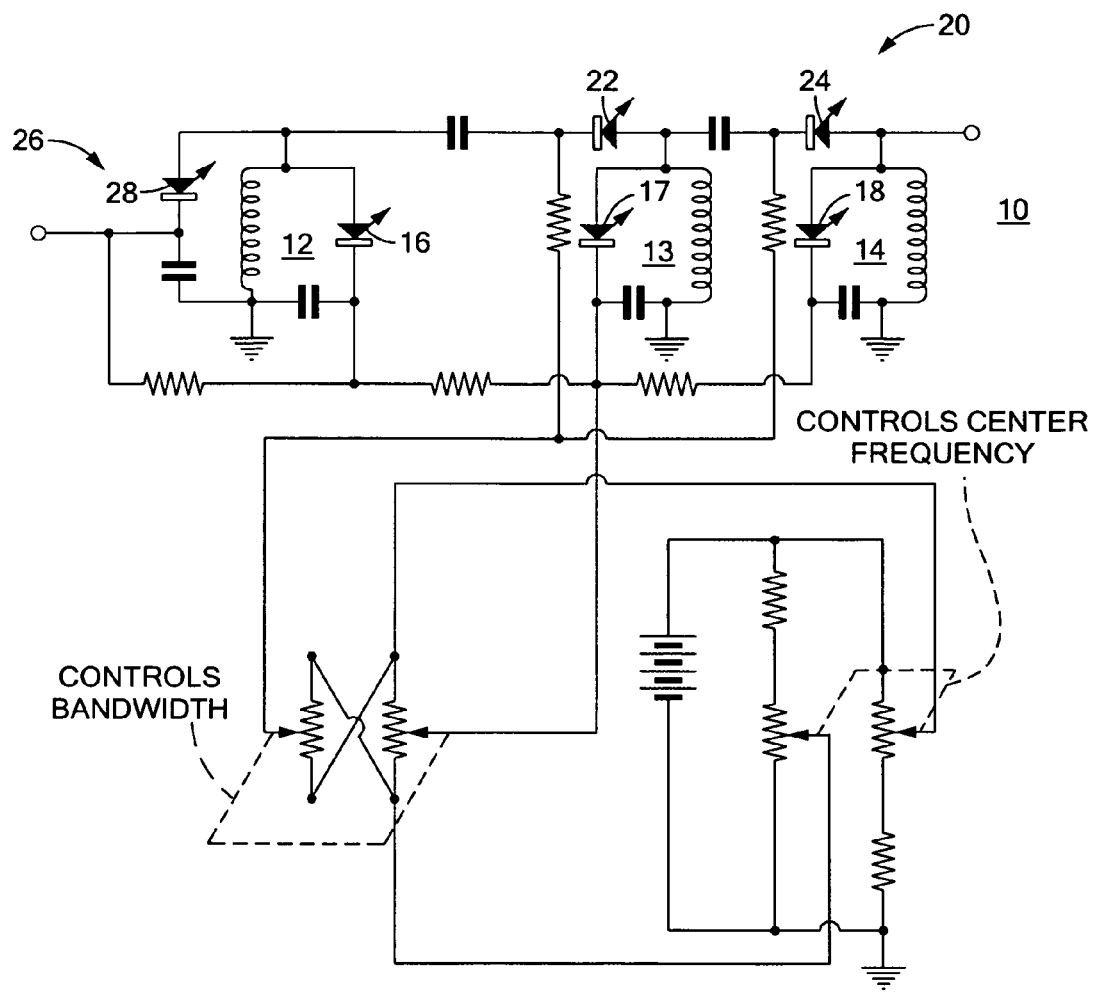
FIG. 1 is a circuit diagram of a prior art bandpass filter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior tunable bandpass filter 10 that includes a multiple tuned resonator filter with each tuned section 12-14 incorporating a variable reactance device 16-18, i.e., a single varactor. Filter 10 also includes a reactive coupling network 20 with its own variable reactance devices 22, 24, and a variable reactance divider 26 at the input of the first resonator 12 which also incorporates a variable reactance device 28. One disadvantage of the filter in FIG. 1 is that its linearity is less than desirable due to the single ended configuration of its varactors.

Figure 2:
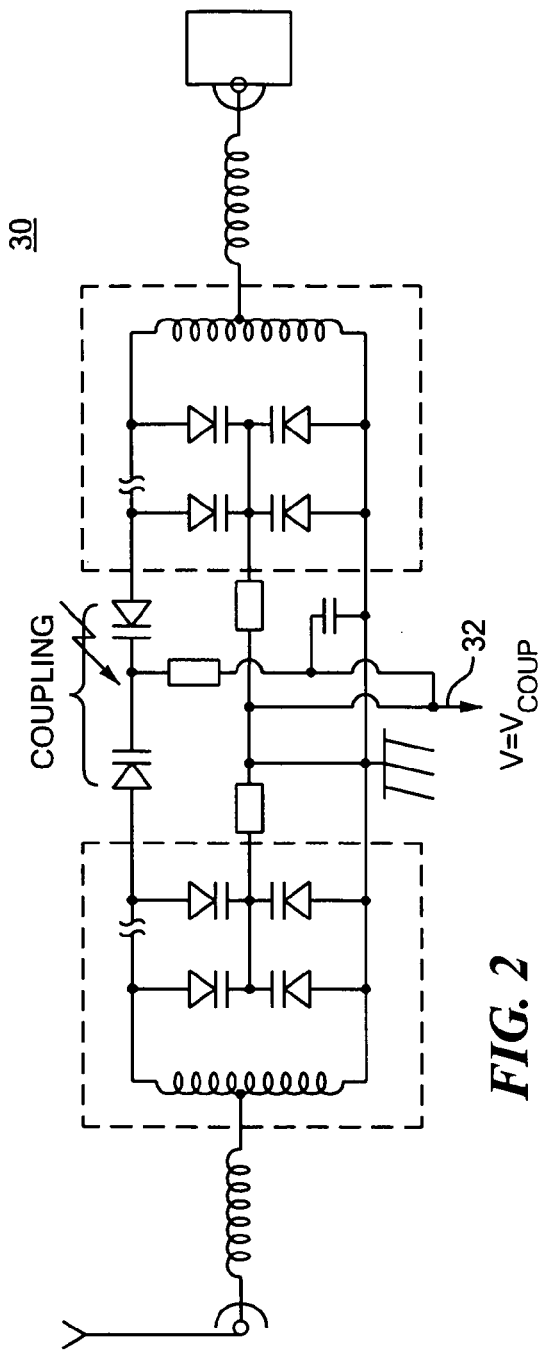
FIG. 2 is a circuit diagram of another prior art bandpass filter.

Another prior bandpass filter 30, FIG. 2, has its tuning voltage on line 32 applied both to resonator varactors and to coupling varactors. As described above, bandpass filter 30 cannot provide independent control of the frequency and bandwidth.

Figure 3:
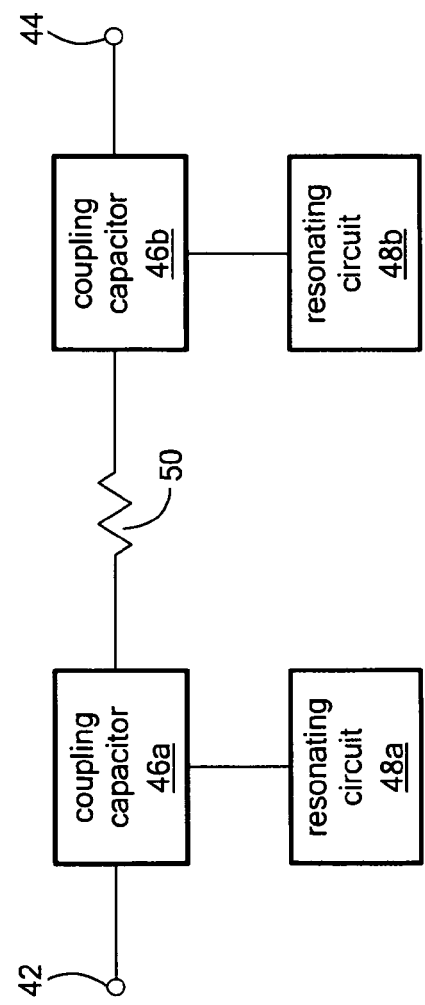
FIG. 3 is a circuit diagram of one embodiment of the wideband bandpass filter in accordance with the subject invention.

In accordance with the invention, a wideband analog bandpass filter 40, FIG. 3, that provides high linearity includes an RF input terminal 42, an RF output terminal 44, and a plurality of electrically tunable coupling capacitors 46a, 46b coupled in series between RF input and output terminals 42, 44. A plurality of resonating circuits 48a, 48b each include an electrically tunable resonator capacitor coupled to one of the coupling capacitors. To provide enhanced out of band rejection of the filter, at least one resistance 50 is coupled between the RF input and output terminals 42, 44 in series with at least one of the coupling capacitors 46a and/or 46b.

Figure 4:
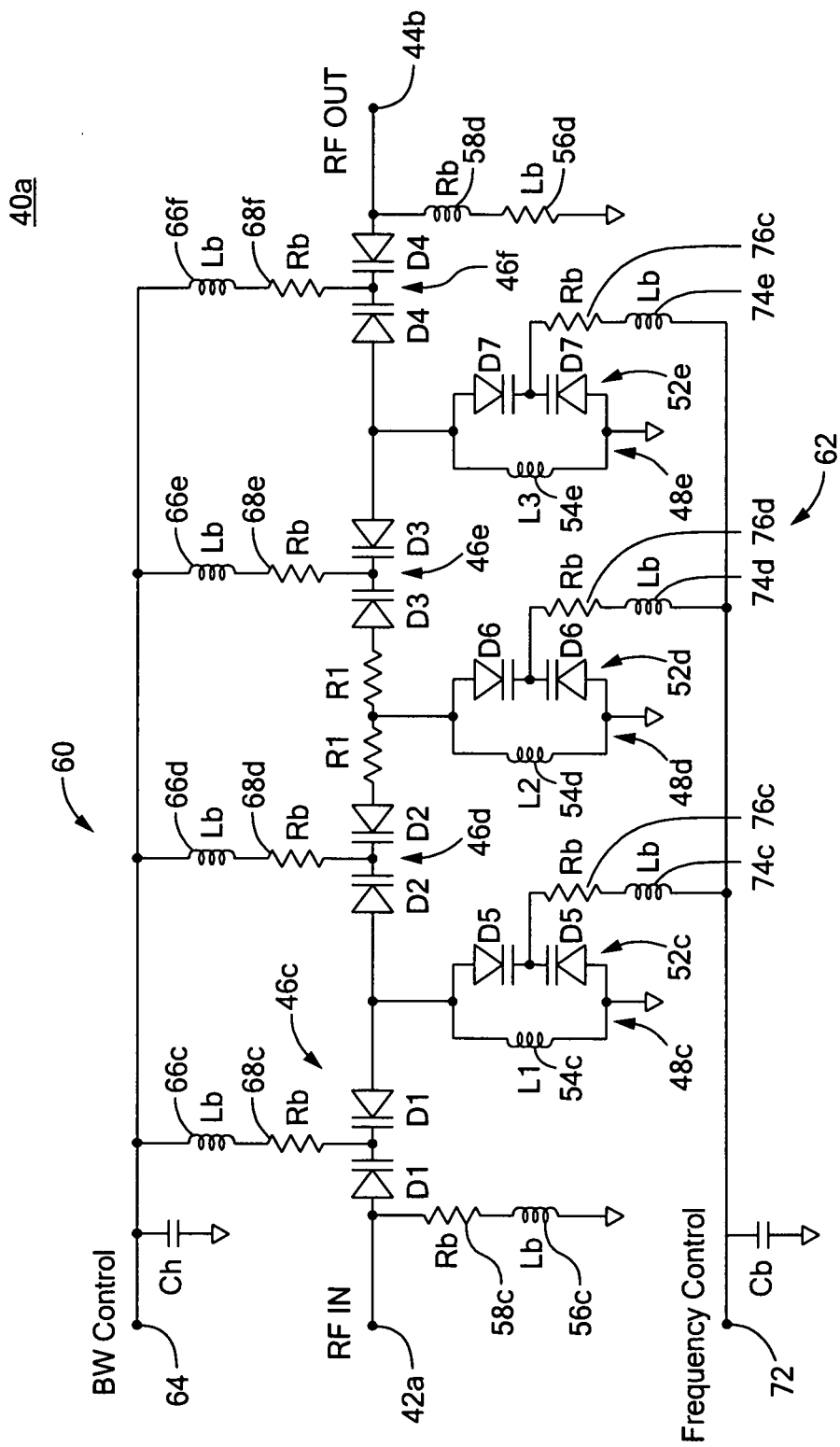
FIG. 4 is a circuit diagram of a more detailed embodiment of the wideband bandpass filter of FIG. 3.

Another embodiment of wideband analog bandpass filter 40a, FIG. 4, takes the configuration of a "Top C" coupled, third-order lumped element Chebyshev filter and includes back to back varactors 46c-46f to provide electrically tunable coupling capacitance. Resonating circuits 48c-48e each include a pair of back to back varactors 52c-52e which are respectively coupled in parallel with inductors 54c-54e. Inductors 54c-54e may be implemented as short transmission lines. Resonating circuits 48c-48e are each coupled to at least one of the pairs of coupling varactors 46c-46f.

Resistances 56c-d are coupled between the RF input and output terminals 42a, 44a in series between coupling capacitors 46d and 46e to enhance the out of band rejection of the filter. Inductors 56c-56d are respectively connected in series with resistors 58c-58d which in turn are respectively coupled to coupling varactors 46c and 46f.

First and second control circuits 60 and 62 are used to provide independent control of the bandwidth and center frequency of the filter. First control circuit 60 is coupled to coupling varactors 46c-46f to adjust the bandwidth of the filter system. First control circuit 60 includes a bandwidth control terminal 64, and an inductance 66c-66f and a resistance 68c-68f coupled in series between the frequency control terminal and each of the pairs of coupling varactors 46c-46f for tuning the coupling varactors.

Second control circuit 62 is coupled to resonating circuits 48c-48e to adjust the center frequency of the filter system. Second control circuit 62 includes a frequency control terminal 72, and an inductance 74c-74e and a resistance 76c-76e coupled in series between the frequency control terminal and each of the pairs of resonating varactors 52c-52e for tuning the resonating circuits.

The linearity of filter 40a is improved by incorporating back to back pairs of varactors in the filter substantially eliminating the non-symmetrical variation of capacitance under ac excitation around a given dc operating point. The back to back pairs of varactors in FIG. 4 are shown coupled as cathode to cathode, but each may alternatively be coupled as anode to anode. Other electrically tunable capacitors could be used instead of back to back pairs of varactors, such as a single varactor, a ferroelectric based capacitor, a MEMS-based capacitor, and/or a field effect transistor (FET) that uses the capacitance between the gate and the source of the FET.

Resistors 50a and 50b provide significant additional out of band rejection in the frequency range where the resonator inductors 54c-54e no longer provide the lumped element equivalent inductance as is the case in the frequency range of the pass band. Resistors 50a and 50b are preferably non-parasitic resistances such as those parasitically provided by the varactors or connection lines.

The value of resistors 50a and 50b may be chosen by balancing the tradeoff between passband insertion loss and out of band rejection. Resistors 50a and 50b may have a value in the range of greater than zero to 100 Ohms, or even greater. More preferably, resistors 50a and 50b may have a value in the range of greater than zero to 50 Ohms. Even more preferably, resistors 50a and 50b may have a value in the range of greater than zero to 20 Ohms. Resistors 50a and 50b are shown in FIG. 4 as each having an acceptable value of 4 Ohms which provides minimal insertion loss but provides acceptable out of band rejection. Preferably the value of resistors 50a and 50b are chosen so that the passband insertion loss is increased by less than one dB.

Although this embodiment illustrates filter 40a with three resonator sections 48c-48e, the same techniques could be used with a different number of resonator sections. In addition to the "top-c" Chebyshev topology given here as an example many other topologies are possible including Butterworth, Bessel, Cauer-Chebyshev, Eliptic, etc. A preferable feature is that the resonant sections and the coupling between sections include tunable capacitors that allow for the tuning of center frequency and bandwidth.

Figure 5A:
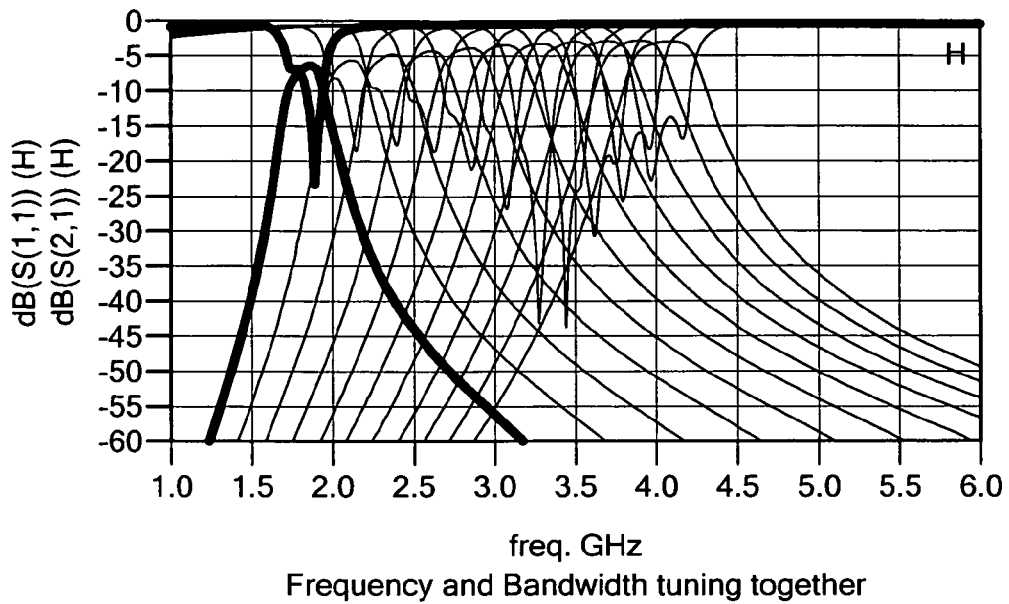
FIGS. 5a and 5b are plots showing the response of the wideband bandpass filter of FIG. 4 with the resonator and bandwidth controls, respectively, being varied.
Figure 5B:
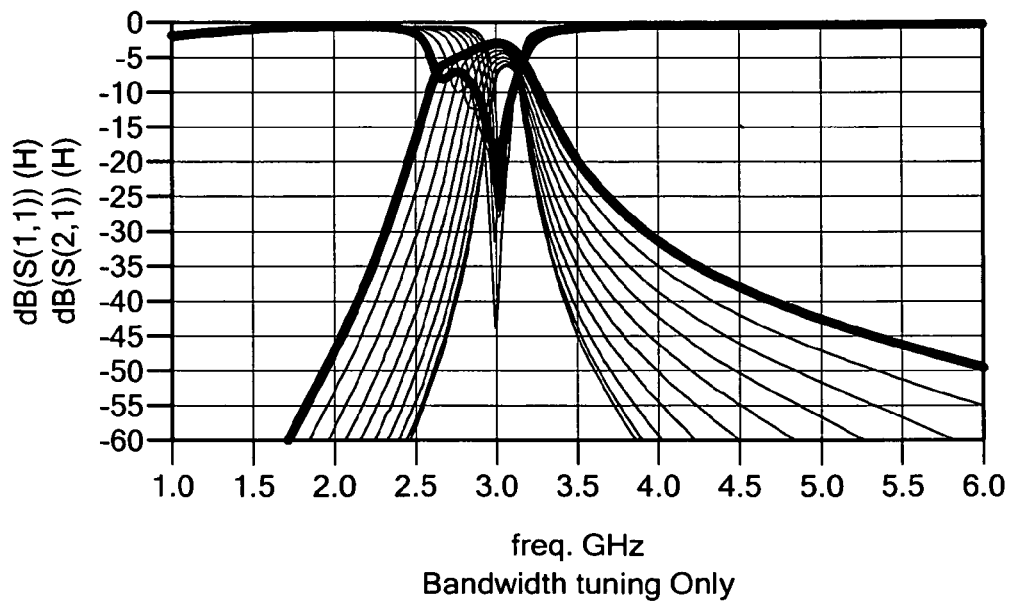

A plot, FIG. 5a, shows the bandpass filter response with both the resonator and bandwidth controls are being varied. FIG. 5b shows how the bandwidth of the filter changes while holding the resonator tuning voltage constant and only varying the tuning voltage of the pairs of coupling varactors 46c-46f.

Figure 6:
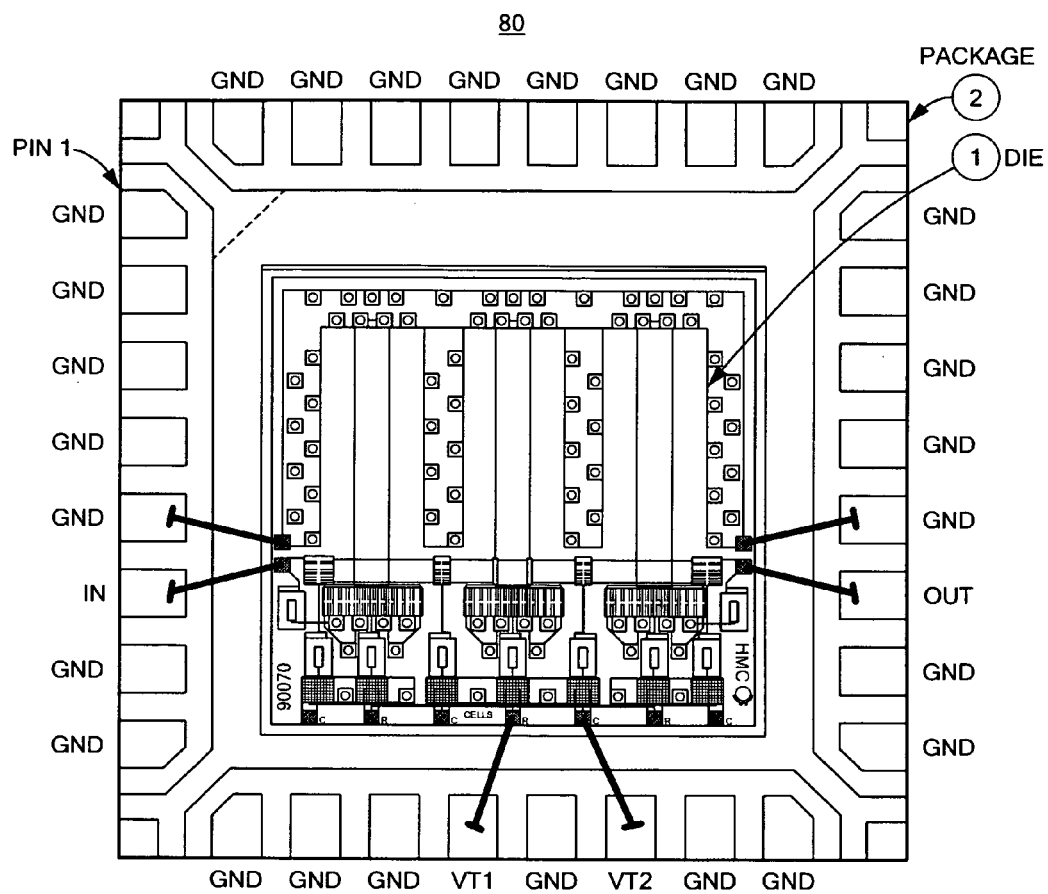
FIG. 6 is a layout of a die and the bonding diagram for the wideband bandpass filter of FIG. 4.

One possible layout of the MMIC die 80, FIG. 6, and the bonding diagram shows how the MMIC die can be assembled into a surface mount package which enables use of low-cost assembly technology. The filter may be implemented on a planar monolithic substrate which for example may be a GaAs or SiGe substrate.

Figure 7:
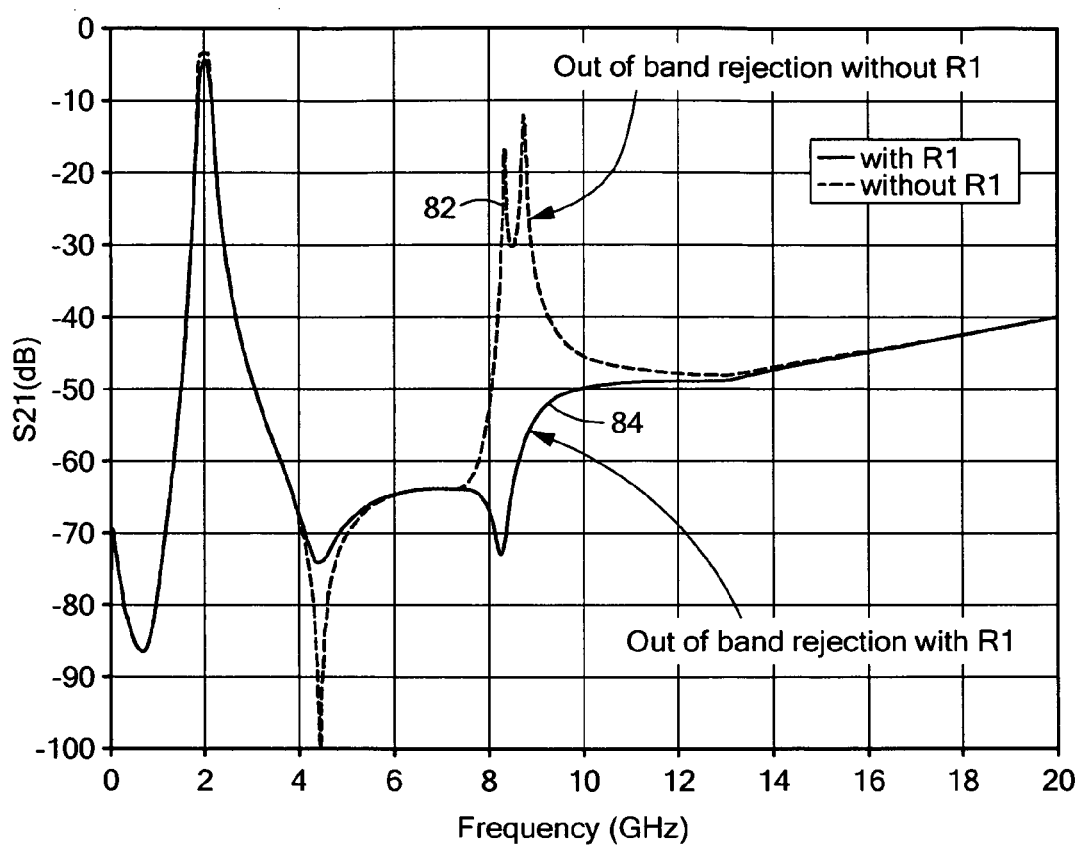
FIG. 7 is a plot showing the response of the bandpass filter for a given frequency and bandwidth for the wideband bandpass filter of FIG. 4 showing the out of band performance dependence on R1.

The response of the bandpass filter, FIG. 7, at a given frequency and bandwidth illustrates the effectiveness of resistances 50a and 50b at significantly improving the out of band rejection. Point 82 shows the less than desirable out of band rejection without the use of resistors 50a and 50b. Point 84 shows the significantly improved out of band rejection with the use of resistors 50a and 50b in series with the pairs of coupling varactors 46c-46f.

Embodiments of the invention provide a bandpass filter with high linearity which may be both tunable in center frequency and bandwidth. In addition, the out of band rejection may remain high and extends several octaves or more beyond the initial stop band to ensure that spurious far from the carrier frequency do not re-enter the system in some manner. The subject bandpass filter may achieve the above performance with relatively low and flat insertion loss. The subject bandpass filter may also have its circuit realized in a monolithic fashion to benefit from the consistency of the many reactive elements, reduced size, low cost, and the possibility to integrate other active or passive circuit functions on the same die.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A bandpass filter, comprising:
a radio frequency (RF) input terminal;
an RF output terminal;
a plurality of electrically tunable coupling capacitors coupled in series between the RF input and output terminals;
a plurality of resonating circuits each including an electrically tunable resonator capacitor and an inductor in parallel with the electrically tunable resonator capacitor, the electrically tunable resonator capacitor being coupled to at least one of the coupling capacitors; and
at least one non-parasitic resistor coupled between the RF input and output terminals in series with at least one of the coupling capacitors, wherein the bandpass filter is configured to pass frequencies within a passband and reject frequencies outside of the passband, and wherein the at least one non-parasitic resistor is configured to provide enhanced out of band rejection of the bandpass filter by attenuating spurious responses outside of the passband of the bandpass filter.

2. The bandpass filter of claim 1, further including a first control circuit coupled to at least one of the coupling capacitors and configured to adjust the bandwidth of the filter.

3. The bandpass filter of claim 2 in which the first control circuit includes a bandwidth control terminal, and the first control circuit further includes an inductance and a resistor coupled in series between the bandwidth control terminal and each of the coupling capacitors.

4. The bandpass filter of claim 1, further including a second control circuit coupled to at least one of the resonator capacitors of the resonating circuits and configured to adjust a center frequency of the filter.

5. The bandpass filter of claim 4 in which the second control circuit includes a frequency control terminal, and the second control circuit further includes an inductance and a resistor coupled in series between the frequency control terminal and each of the resonating capacitors.

6. The bandpass filter of claim 1 in which each of the resonator capacitors includes a varactor.

7. The bandpass filter of claim 6 in which each of the varactors includes two diodes coupled together.

8. The bandpass filter of claim 6 in which each of the varactors includes only one diode.

9. The bandpass filter of claim 6 in which each of the varactors includes a p-n junction.

10. The bandpass filter of claim 6 in which each of the varactors includes a field effect transistor (FET).

11. The bandpass filter of claim 6 in which each varactor includes a MEMS-based capacitor.

12. The bandpass filter of claim 1 in which the filter is implemented on a planar monolithic substrate.

13. The bandpass filter of claim 12 in which the monolithic substrate is one of a GaAs substrate or a SiGe substrate.

14. The bandpass filter of claim 12 in which the monolithic substrate is mounted in a surface-mount package.

15. The bandpass filter of claim 1 in which each coupling capacitor includes a ferroelectric based capacitor.

16. The bandpass filter of claim 1 in which the at least one non-parasitic resistor includes first and second resistors coupled together with one of the resonating circuits coupled to a node between the first and second resistors.

17. The bandpass filter of claim 1 in which the at least one non-parasitic resistor has a value between a range of greater than zero Ohms and up to 100 Ohms.

18. A bandpass filter, comprising:
an RF input terminal;
an RF output terminal;
a plurality of electrically tunable pairs of varactors coupled back-to-back in series between the RF input and output terminals;
a plurality of resonating circuits each including an electrically tunable resonator capacitor and an inductor in parallel with the electrically tunable resonator capacitor, the electrically tunable resonator capacitor being coupled to at least one of the pairs of varactors; and
at least one non-parasitic resistor coupled in series between the plurality of electrically tunable varactors, wherein the bandpass filter is configured to pass frequencies within a passband and reject frequencies outside of the passband, and wherein the at least one non-parasitic resistor is configured to provide enhanced out of band rejection of the bandpass filter by attenuating spurious responses outside of the passband of the bandpass filter.

19. The bandpass filter of claim 18, further including a first control circuit coupled to at least one of the pairs of varactors and configured to adjust the bandwidth of the filter.

20. The bandpass filter of claim 19 in which the first control circuit includes a bandwidth control terminal, and the first control circuit further includes an inductance and a resistor coupled in series between the bandwidth control terminal and each of the pairs of varactors.

21. The bandpass filter of claim 18, further including a second control circuit coupled to at least one of the resonator capacitors of the resonating circuits and configured to adjust a center frequency of the filter.

22. The bandpass filter of claim 21 in which the second control circuit includes a frequency control terminal, and the second control circuit further includes an inductance and a resistor coupled in series between the frequency control terminal and each of the resonating capacitors.

23. The bandpass filter of claim 21 in which the configuration of the filter includes a Chebyshev filter.

24. The bandpass filter of claim 23 in which the Chebyshev filter is a third order filter.

\* \* \* \* \*